United States Patent
Yoneda

(10) Patent No.: US 6,336,113 B1
(45) Date of Patent: Jan. 1, 2002

(54) DATA MANAGEMENT METHOD AND DATA MANAGEMENT APPARATUS

(75) Inventor: Masato Yoneda, Chiba (JP)

(73) Assignee: Kawasaki Steel Corporation, Hyogo (JP)

( * ) Notice: Subject to any disclaimer, the term of this patent is extended or adjusted under 35 U.S.C. 154(b) by 0 days.

(21) Appl. No.: 09/223,324

(22) Filed: Dec. 30, 1998

(51) Int. Cl.$^7$ .............................. G06F 7/00; G06F 17/30
(52) U.S. Cl. .................. 707/6; 707/103; 707/104; 707/206; 711/145; 711/159; 711/212; 711/219
(58) Field of Search ............................ 707/3, 4, 6, 200, 707/206, 7; 711/112, 128, 135, 203, 206, 133, 159, 216, 219

(56) References Cited

U.S. PATENT DOCUMENTS

| | | | | |
|---|---|---|---|---|
| 3,913,075 A | * | 10/1975 | Vitaliev et al. ............... | 340/173 |
| 4,622,653 A | * | 11/1986 | McElroy ........................ | 365/49 |
| 4,888,731 A | * | 12/1989 | Chuang et al. ................ | 365/49 |
| 4,890,260 A | * | 12/1989 | Chuang et al. ................ | 365/49 |
| 5,099,445 A | * | 3/1992 | Studor et al. ............. | 364/715.08 |
| 5,442,576 A | * | 8/1995 | Gergen et al. ............ | 364/715.08 |
| 5,559,730 A | * | 9/1996 | Marui et al. ............. | 364/715.08 |
| 5,619,446 A | * | 4/1997 | Yoneda et al. ................. | 365/49 |
| 5,745,744 A | * | 4/1998 | Bechade ........................ | 395/565 |
| 5,860,085 A | * | 1/1999 | Stormon et al. ............. | 711/108 |
| 5,893,137 A | * | 4/1999 | Parks et al. .................. | 711/108 |

* cited by examiner

*Primary Examiner*—Thomas Black
*Assistant Examiner*—Jacques Veillard
(74) *Attorney, Agent, or Firm*—Oliff & Berridge, PLC

(57) ABSTRACT

A data management method is first used for registering the plurality of entry data having n-bit length and performing match retrieval by masking a (n−m(i)) bit from the least significant bit side, whereby to detect the value of an m(i) bit from the side of the most significant bit matching a specific entry data. Then match retrieval is performed repeatedly by shifting a bit to be masked by an m(i+1) bit each time toward the low order side and detecting a corresponding value of m(i+1) bit until no bit to be masked exists so as to detect the value of an n bit matching the entry data. Further, an entry address at which the specific entry data matching the value of the n bit thus detected has been registered is obtained in order that a new entry data is registered at the entry address. A data management apparatus has a control circuit for controlling the operation of the associative memory in accordance with the data management method according to the present invention.

14 Claims, 4 Drawing Sheets

DATA MANAGEMENT METHOD AND DATA MANAGEMENT APPARATUS

BACKGROUND OF THE INVENTION

The present invention relates to a data management method and apparatus for use when entry data is registered in an entry table.

DESCRIPTION OF THE PRIOR ART

FIG. 7 is an example of a conceptual diagram explaining about a conventional data management method.

A high-speed semiconductor memory such as SRAM, for example, is used as an entry table 30 and a predetermined number of entry data 32 are registerable in the entry table 30. Usually, the number of entry data 32 registerable in the entry table 30 is limited and entry data 32 of 1K (=1,024) are assumed to be registerable in this case. The entry data 32 registered in the entry table 30 can be used by reading out the data as occasion demands.

When a request for the registration of a new entry data 34 is made to the entry table 30, the new entry data 34 is basically registered at a free entry address in the entry table 30. In case no free entry address is found, however, an unwanted entry data is detected and deleted out of the entry data 32 of 1K already registered, so that the new entry data 34 is registered at the entry address thus deleted.

In this case, the unwanted entry data is set properly by a user of a data management apparatus as necessary by setting at least one specific condition for the management of the entry data 32 registered in the entry table 30 such that the unwanted entry data is determined by an order of registration or from the fact that it remains less frequently used or unused for a predetermined time, for example.

A description will subsequently be given of an example of the prior art data management method in order to understand problems pertaining thereto. In order to simplify an explanation, it will be assumed that the entry data 32 registered in the entry table 30 are arranged in order of size and when a request for the registration of the new entry data 34 is made, what has the lowest value, for example, among the entry data 32 of 1K registered in the entry table 30 is to be treated as what is unwanted and deleted.

In this case, it becomes necessary to detect an entry address at which the new entry data 34 should be registered and to rearrange the entry data 32 accordingly. By doing a binary search eleven times through the entry data of 1K, for example, the entry address at which the new entry data 34 should be registered can be calculated. The time required for calculating the entry address is 1.1 μs on the assumption that the time required for doing one binary search is 100 ns.

For rearranging the entry data 32 in order of size, it is necessary that not only reading the entry data 32 whose respective values are smaller than that of the new entry data 34 sequentially but also writing them at destination entry addresses sequentially as shown in FIG. 7. Assuming that 50 ns is necessary for moving one entry data 32, the time required to move all of the entry data 32 amounts to 50 μs (1K×50 ns) when things come to the worst in a case where the new entry data 34 has the largest value (see FIG. 7).

In the prior art data management method and apparatus so designed as to make a rearrangement of entry data 32, a relatively long time is needed until the new entry data 34 is registered despite the use of a high-speed semiconductor memory such as SRAM and an objective retrieval operation is unperformable during this time. Although the number of entry data 32 registerable in the entry table 30 has been set at 1K as described above, the time required for the management of entry data increases as the number of entry data increases because there may be a case where more entry data are registered.

Consequently, there is a problem that the prior art data management method and apparatus is unfit for use which requires simultaneous data update and high speed retrieval operation, for example, Internet network addresses.

PROBLEMS TO BE SOLVED BY THE INVENTION

An object of the present invention is to solve the above mentioned prior art problem, and to provide a data management method and apparatus capable of managing entry data at high speed through a simple procedure and with a simple configuration.

In order to accomplish the object above, the present invention provides a data management method for use when a demand for the registration of a new entry data is made in order to register the new entry data by deleting a specific entry data out of a plurality of n-bit (n=a positive integer) entry data registered beforehand, comprises the steps of:

registering the plurality of entry data having n-bit length;

performing match retrieval repeatedly by masking a (n−m(i)) bit (m(i)=a positive integer satisfying n≧m(i)) from the least significant bit side, whereby detecting the value of an m(i) bit from the side of the most significant bit matching the specific entry data;

performing match retrieval by shifting a bit to be masked next by an m(i+1) bit (m(i+1) a positive integer satisfying (n−m(i))≧m(i+1)) toward the low order side and detecting a corresponding value of m(i+1) bit until no bit to be masked exists so as to detect the value of an n bit matching the specific entry data; and obtaining an entry address at which the specific entry data matching the value of the n bit thus detected has been registered, so that the new entry data is registered at the entry address.

It is preferred that match retrieval is performed again by the use of the value of the n bit matching the specific entry data thus detected so as to detect the entry address of the specific entry data.

Preferably, the specific entry data has the lowest value, the highest value or a value nearest a predetermined value. A condition for the detection of the specific entry data is preferably one of entry data registration order, frequency in use and elapsed time after the registration.

The m(i+1) bit is preferably one bit or two bits.

Also the present invention provides a data management apparatus comprises:

an associative memory having at least one mask register for masking the predetermined bit of retrieval data, and at least a memory array in which a plurality of n-bit (n=a positive integer) entry data are registered, the memory array being used for performing match retrieval of the retrieval data masked by the mask register and the plurality of entry data; and a control circuit for controlling the associative memory in such a way as performing match retrieval by masking an (n−m(i)) bit (m(i)=a positive integer satisfying n≧m (i)) from the least significant bit side of the retrieval data by means of the mask register, detecting the value of the m(i) bit from the side of the most significant bit matching the specific entry data according to a result of match retrieval, and performing match retrieval repeatedly by shifting a bit to be masked next by an m(i+1) bit (m(i+1)=a positive integer satisfying (n−m(i))≧m(i+1)) toward the low order side and detecting a corresponding value of m(i+1) bit until no bit to be masked exists so as to detect not only the value of n bit matching the specific entry data but also an entry address at which the specific entry data has been registered.

It is preferred that the associative memory feeds to the control circuit a hit detection signal for indicating that at least one entry data matching the retrieval data has been registered in the memory array.

The control circuit is preferably formed of only hardware.

The associative memory and the control circuit are preferably formed of a semiconductor chip.

The control circuit is preferably formed of only software or a combination of software and hardware.

The m(i+1) bit is preferably one bit or two bits.

The mask register preferably has a function of shifting a bit to be masked by the m(i+1) bit each time toward the low order side under the control of the control circuit.

It is preferred that the associative memory further includes an input data register for holding the retrieval data and wherein the input data register is capable of setting and resetting the value of the retrieval data on a 1-bit basis under the control of the control circuit.

In the data management method and apparatus according to the present invention, a specific entry data is detected out of the entry data registered in the associative memory so that a new entry data can be registered at the entry address of the entry data thus detected, in other words, the use of the associative memory makes it unnecessary to rearrange the entry data, thus it is easy to process data, and the rearrangement of the entry data can be performed at an extremely high speed, irrespective of the number of registered entry data.

DETAILED DESCRIPTION OF THE INVENTION

A detailed description will subsequently be given of a data management method and apparatus according to the present invention with reference to the accompanying drawings showing the preferred embodiments thereof.

Figure 1:
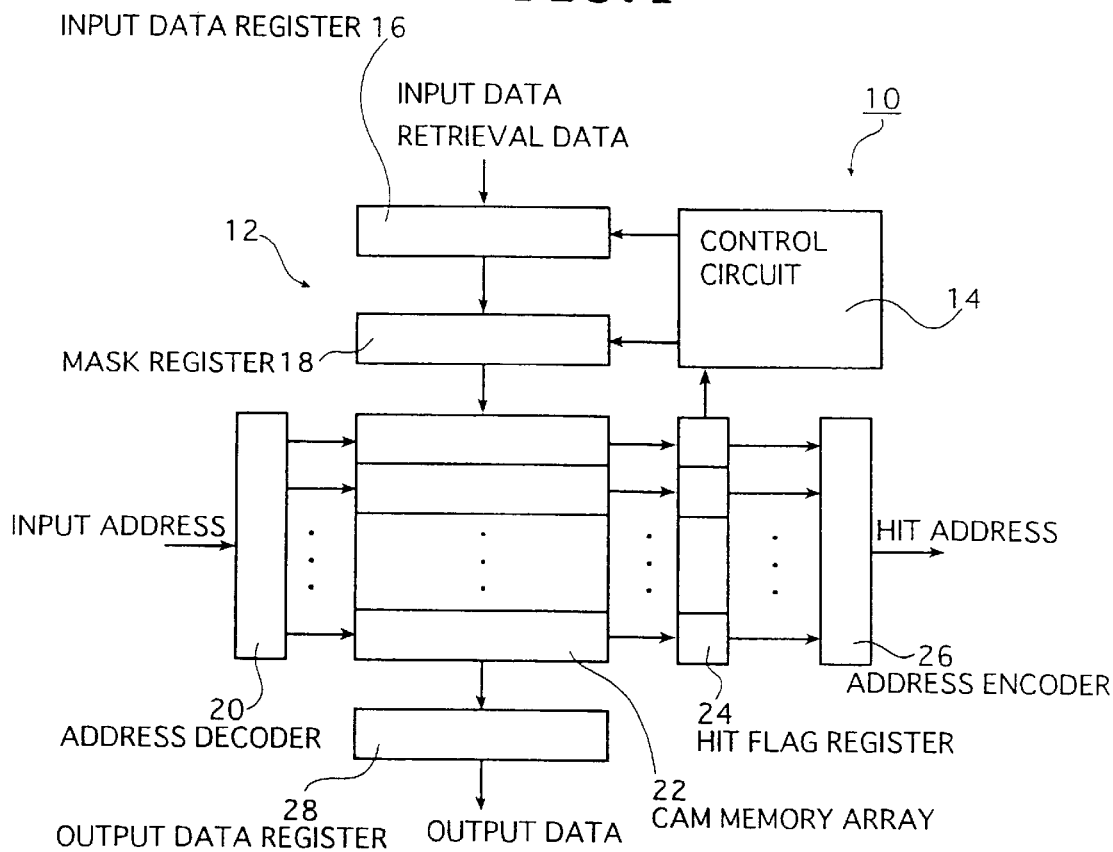
FIG. 1 is a structural conceptual diagram of an embodiment of a data management apparatus of the present invention.

FIG. 1 is a structural conceptual diagram of an embodiment of a data management apparatus of the present invention.

An exemplary data management apparatus 10 shown in FIG. 1 comprises an associative memory 12 and a control circuit 14 for controlling the associative memory 12.

The associative memory 12 of the data management apparatus 10 is a Content Addressable Memory (as hereinafter called the CAM), wherein a predetermined number of entry data are registered beforehand. Then retrieval data are fed into the CAM so that the retrieval data are simultaneously compared with each entry data, memory addresses where the entry data matching the retrieval data are stored (hit addresses) are outputted sequentially, in the predetermined order of priority, for example.

In the case illustrated in FIG. 1, the CAM 12 comprises an input data register 16 for holding input data or retrieval data, a mask register 18 for holding mask data, an address decoder 20 for decoding input addresses, a CAM memory array 22 having a predetermined number of memory words constituting an entry table in which entry data are registered, a hit flag register 24 for holding hit flags, an address encoder 26 for encoding the hit addresses, and an output data register 28 for holding output data.

In the CAM 12, the registration of entry data into the respective memory words of the CAM memory array 22 is carried out by inputting the input address into the address decoder 20 and writing the input data as an entry data to the input data register 16. Then the input address is decoded by the address decoder 20 and the entry data held in the input data register 16 is written into the memory word corresponding to the input address.

The retrieval operation is started after the mask data for masking the retrieval data on a bit basis is written into the mask register 18 and the retrieval data is written into the input data register 16. Then the predetermined bits of the retrieval data are masked by each corresponding bit of the mask data, so that bit data which is not masked by the mask data in the retrieval data is simultaneously compared with the entry data stored in each of the memory words of the CAM memory array 22.

When the retrieval operation is finished, a hit flag as a retrieval result is outputted from each of the memory words of the CAM memory array 22. The hit flag outputted from each memory word represents an active state, that is, "1", for example, when the retrieval data matches with the entry data, and a nonactive state, that is "0", for example, when these do not match with each other. Then the hit flag outputted from each of the memory words is held in the hit flag register 24.

The hit flag held in the hit flag register 24 is inputted into the address encoder 26, and the hit address of the memory word corresponding to the hit flag in the highest priority among the hit flags in the active state is encoded and outputted.

The hit address outputted from the address encoder 26 is inputted to the address decoder 20 as occasion demands and output data is read from the memory word corresponding to the hit address and held in the output data register before being outputted.

In this case, changing the hit flag in the highest priority among the active state hit flags held in the hit flag register 24 to the nonactive state as occasion demands and then changing the hit flag in the next highest priority to the highest priority, whereby memory addresses of the memory words corresponding to the hit flags in the highest priority will be obtained one after another.

The CAM 12 operates basically such as described above.

The control circuit 14 controls the CAM 12 in such a way as performing match retrieval according to the data management method of the present invention by masking an (n−m(i)) bit (m(i)=a positive integer satisfying n≧m(i)) from the least significant bit side of the retrieval data when the bit length of entry data is n bit (n=a positive integer), detecting the value of the m(i) bit from the side of the most significant bit matching the entry data in accordance with the state of a hit detection signal as a result of the match retrieval, and sequentially performing match retrieval repeatedly at maximum ((n/m(i+1))+1) times by shifting a bit to be masked next by m(i+1) bit (m(i+1)=a positive integer satisfying (n−m(i))≧m(i+1)) toward the low order side and detecting a corresponding value of m(i+1) bit until no bit to be masked exists so as to detect not only the value of n bit matching the entry data but also an entry address at which the specific entry data has been registered.

In this case, the hit detection signal is a logical OR signal of all the hit flags held in the hit flag register 24. When the hit detection signal turns to the active state as a result of the match retrieval, it means that at least one entry data matching the retrieval data has been registered in the CAM memory array 22, whereas when the signal turns to the nonactive state, no entry data matching the retrieval data has been registered therein.

The aforesaid m(i) bit (i=0, 1, 2, . . . ) is not particularly specified but may be any number as long as Σm(i)=n and for simplifying an implementation, it is assumed that always m(i)=1 or 2 in numerical value.

The data management apparatus according to the present invention is formed basically such as described above.

In the data management apparatus according to the present invention, it is necessary that the CAM 12 has at least one mask register 18 and outputs a signal equivalent to the hit detection signal. Except such an arrangement as aforesaid, no restriction is imposed on the circuit configuration of the CAM 12.

Part of or all of the control circuit 14 may be implemented by software to control the CAM 12, or part of or all of the control circuit 14 may be implemented by hardware, or the control circuit 14 may be implemented by a combination of software and hardware. When at least part of the control circuit 14 is implemented by hardware, moreover, it is preferable to provide the associative memory 12 and the control circuit 14 in the form of a semiconductor chip such as the data management apparatus 10 according to the present invention, though different semiconductor chips or parts may be used for implementing the associative memory 12 and the control circuit 14, respectively.

A description will subsequently be given of the operation of the data management apparatus 10 of the present invention together with the data management method thereof.

The following description refers to the case of detecting a specific entry data out of the entry data of 1K (=1,024) registered in the CAM memory array 22 as an entry table, namely, what has the lowest value as the entry data when a demand for the registration of a new entry data is made during the normal retrieval operation in order to facilitate the comparison of this case with the prior art.

Figure 2:
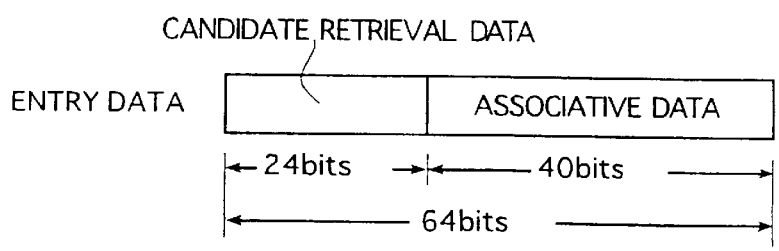
FIG. 2 is a structural conceptual diagram of an embodiment of an entry data according to the present invention.

FIG. 2 is a structural conceptual diagram of entry data.

As shown in FIG. 2, the entry data which is registered in the CAM memory array 22 of the CAM 12 essentially consists of candidate retrieval data in carrying out match retrieval with the retrieval data, and associative data which is read as output data when match is detected. Although the bit length of the entry data is not restrictive at all, 64-bit length is employed according to this embodiment of the invention, wherein 24 bits on the high-order bit side out of the 64 bits designate the candidate retrieval data, whereas the remaining 40 bits on the low-order bit side designate the associative data. In this case, the bit lengths of the candidate retrieval data and the associative data are not restrictive at all, all of entry data may be the candidate retrieval data without providing the associative data, for example.

Figure 3:
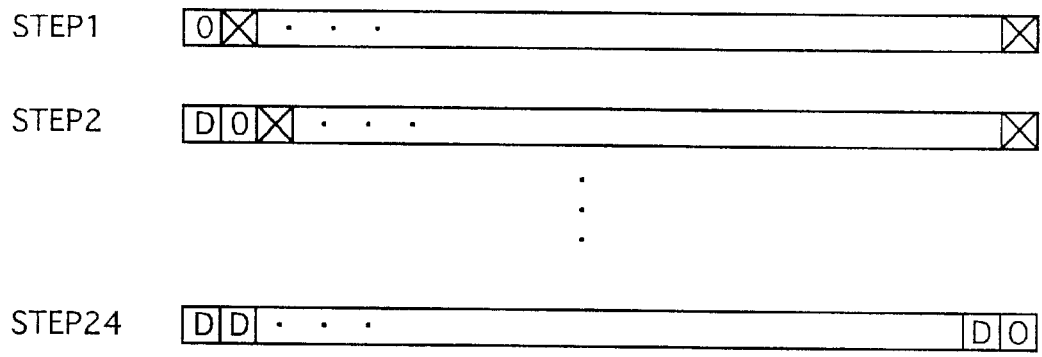
FIG. 3 is a conceptual diagram of a first embodiment explaining a data management method of the present invention.

FIG. 3 is a conceptual diagram of a first embodiment explaining a data management method of the present invention. FIG. 3 conceptually indicates the retrieval data after the masking of the 24-bit length equivalent to the candidate retrieval data in FIG. 2 and in this description of FIG. 3, the bits are called bits 1–24 in order from the least significant bit side on the right-hand side toward the most significant bit side.

In the case of detecting the entry data having the lowest value, at STEP 1 the mask data for masking bits of 1 to 23, for example, "01111111111111111111111" is set in the mask register 18 by the control circuit 14 on condition that retrieval data is masked when "1" is set thereby. Further, retrieval data with the most significant bit 24 as "0" is set in the input data register 16. The retrieval data of the bits 1 to 23 is defined as "1" or "0". Incidentally, the bit with "1" being set as the mask data at STEP 1 of FIG. 3 is indicated with "x" in the sense that no match retrieval will be performed.

Subsequently, match retrieval is performed by the associative memory 12 by using the retrieval data after the masking shown in STEP 1. The control circuit 14 decides whether match or mismatch has been detected from the hit detection signal from the hit flag register 24.

Consequently, it will be made clear that if the match has been detected, entry data having a candidate retrieval data in which the value of the most significant bit 24 is "0" has been registered in the CAM memory array 22, that is, the value of the bit 24 of the entry data having the lowest value is "0". If the match has not been detected conversely, it will also made clear that the bit 24 of the candidate retrieval bit of the whole entry data registered in the CAM memory array 22 is "1", that is, the bit of the entry data having the lowest value is "1".

At STEP 2, further, the mask register 18 is set to mask bits 1 to 22 by the control circuit 14 by shifting the mask data toward the low order bit side by only one bit. Then retrieval data with the bit 23 as "0" is set in the input data register 16. In this case, the value of the bit 24 of the candidate retrieval bit detected at STEP 1 is set to the bit 24 of the retrieval data. At STEP 2 of FIG. 3, the value of the bit 24 of the retrieval data is illustrated as "D".

Similarly, match retrieval is performed by the associative memory 12 by using the retrieval data after masking shown at STEP 2, the value of the bit 23 will be detected in all the same way.

The aforesaid operation is repeated hereafter and mask data for not masking the whole of the bits 1–24, namely, "000000000000000000000000" is set in the mask register 18 by the control circuit 14 at STEP 24. Further, the values of the bits 2–24 are used as those of the bits 2–24 of the candidate retrieval bit detected at STEPS 1–23 and the retrieval data with the value of the bit 1 as "0" is set in the input data register 16.

Similarly, match retrieval is performed by the associative memory 12 by using the retrieval data shown at STEP 24, it will be detected that whether the value of the bit 1 is "0" or "1".

If the bit 1 of the candidate retrieval bit of the entry data having the lowest value is "0", match is detected and the hit address of the entry data having the lowest value is outputted from the address encoder 26. On the other hand, no match is detected when the bit 1 of the candidate retrieval bit of the entry data having the lowest value is "1", so that the match retrieval is performed again by setting the value of the bit 1 of the retrieval data to "1" in order to cause the hit address of the entry data having the lowest value to be outputted.

Thus, the hit address of the entry data having the lowest value is detected and the new entry data is registered at this hit address.

As shown in this embodiment of the invention, entry data having the lowest value is detected, and the new entry data can be registered by performing the match retrieval maximum 25 times in the data management method and apparatus according to the present invention. Supposing that the time required for performing the match retrieval once is 100 ns, for example, the time required for the match retrieval amounts to 2.5 μs. Moreover, the new entry data can be registered in 5 μs which is 1/10 of the time comparing with that the conventional data management method and apparatus requires, even though it takes twice time necessary for the match retrieval in consideration of cases where the input data register 16 and the mask register 18 are reset according to the hit detection signal and where the time used to delete entry data having the lowest value and to register the new entry data.

The data management method and apparatus according to the present invention is basically such as described above.

Figure 4:
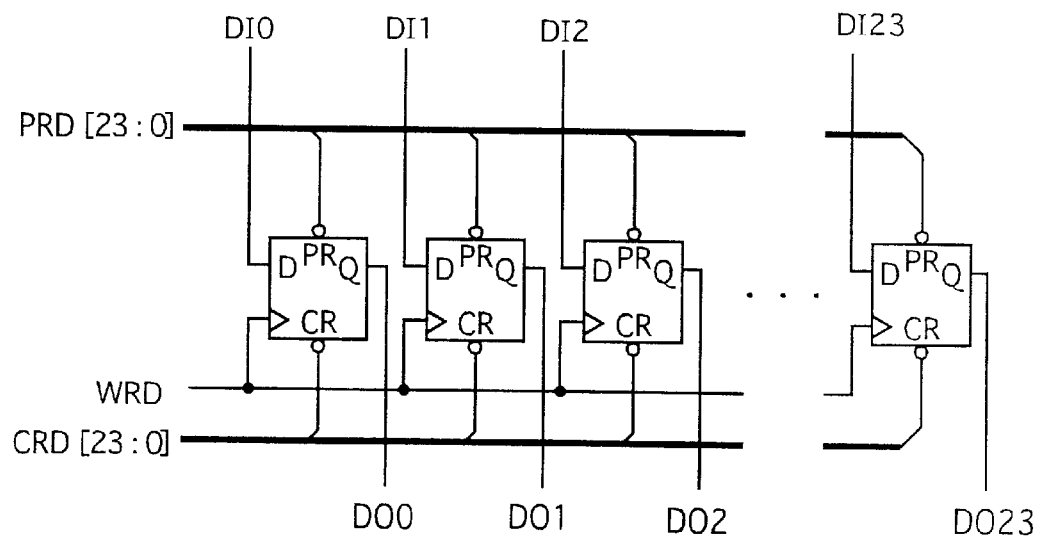
FIG. 4 is configuration circuit diagram of an embodiment of an input data register according to the present invention.

Although an arrangement has been made so that retrieval data is set in the input data register each time according to the aforesaid embodiment of the invention, the invention is not restricted to the arrangement above but it may preferably be configured so that as shown in FIG. 4, for example, retrieval data can be set by using set signals PRD [23:0] and clear signals CRD [23:0] under the control of a control circuit in order to set and reset the input data register to "1" or "0" on a 1-bit basis.

Figure 5:
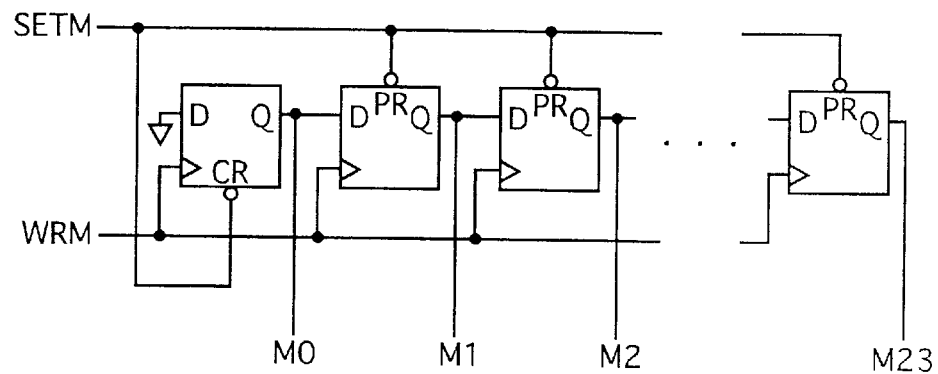
FIG. 5 is configuration circuit diagram of an embodiment of a mask register according to the present invention.

Although it has been arranged according to the aforesaid embodiment of the invention that mask data is reset by shifting the data one by one bit toward the least significant bit side, the invention is not restricted to that arrangement but there is an advantage that the mask register can be reset in a simpler way by forming the mask register into a shift register structure as shown in FIG. 5 because the value of the mask register can be set by initializing the mask register by using a set signal SETM and only giving a write signal WRM under the control of a control circuit. In FIG. 5, the illustration of a circuit for writing data to a mask register is omitted to simplify explanation.

Although the mask register is reset by shifting one bit each time according to the aforesaid embodiment of the invention, the shifting is not limited to one bit but may be carried out in two bits or greater, for example, whereby the number of times the mask register 18 is reset can be halved, though the number of times that the input data register 16 is set and that the match retrieval is performed are increased.

Figure 6:
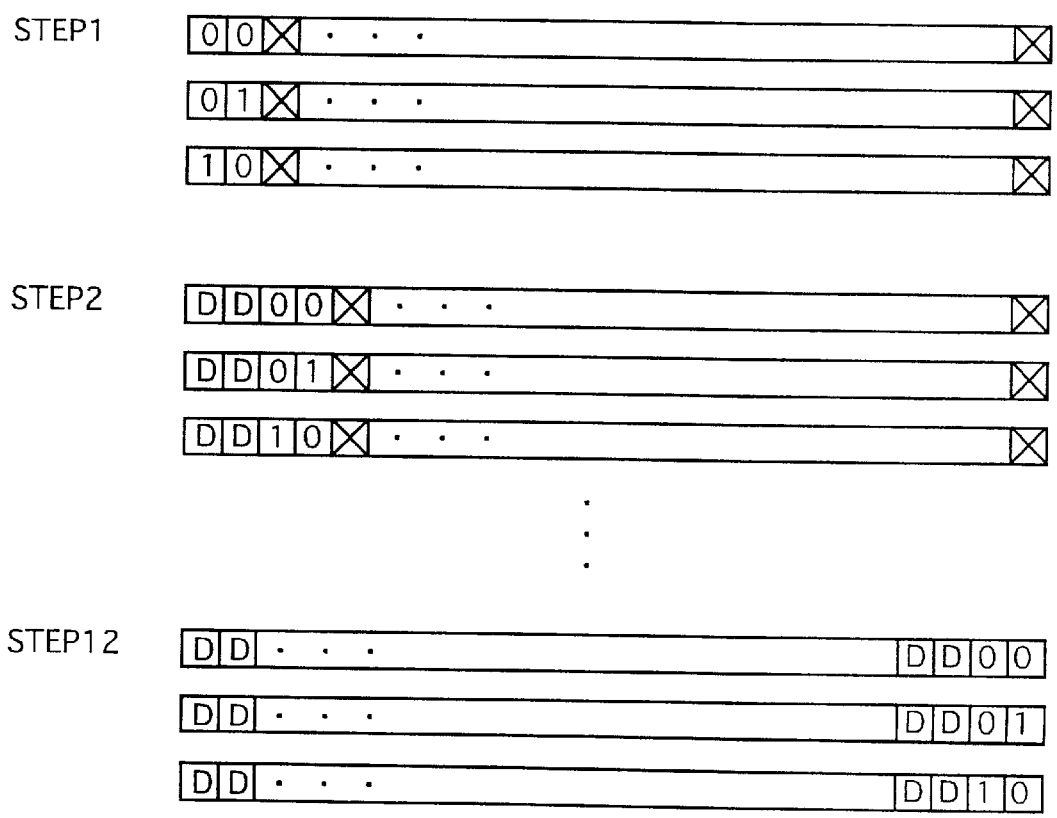
FIG. 6 is a conceptual diagram of a second embodiment explaining a data management method of the present invention.
Figure 7:
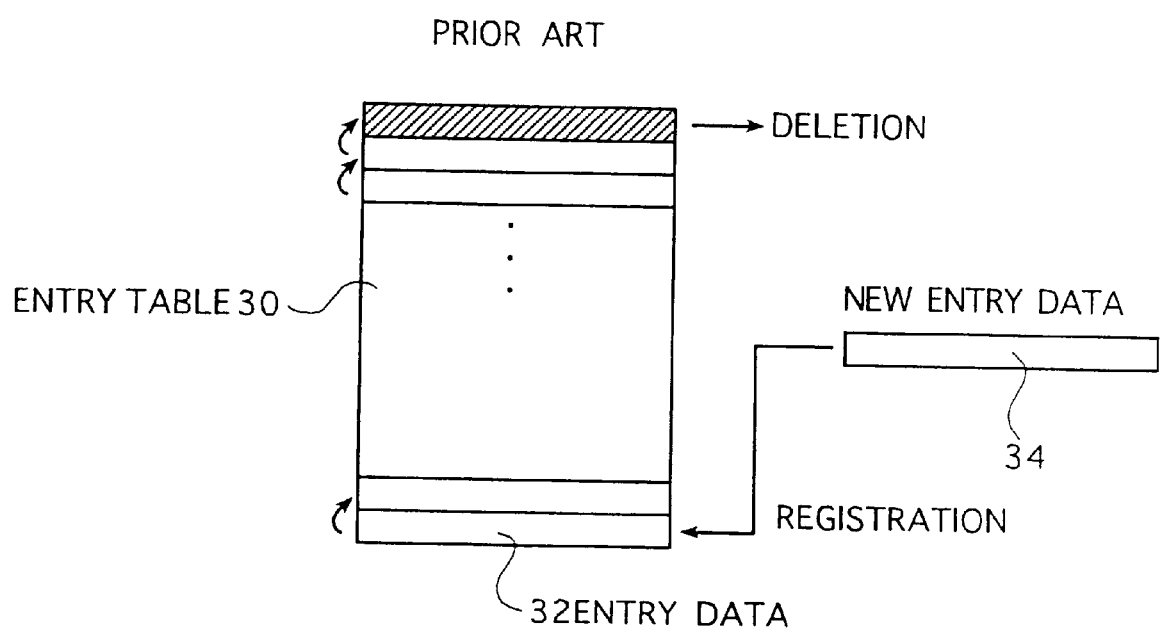
FIG. 7 is a conceptual diagram of an example explaining a conventional data management method.

FIG. 6 is a conceptual diagram of a second embodiment explaining a data management method of the present invention. In FIG. 6, there is shown a case where retrieval data is conceptually indicated when mask data is shifted in two bits each time as stated above.

In this case, mask data for masking bits 1–22 is set in the mask register 18 by the control circuit 14 at STEP 1 first. Then retrieval data with bits 23 and 24 as "00" is set in the input data register 16, and the retrieval data after the masking shown at STEP 1 is used to make the associative memory 12 perform match retrieval. As a result, the values of the bits 24 and 23 are understood to be "00" if match is detected.

If no match is detected, the values of the bits 24 and 23 are reset to "01" and match retrieval is performed again. As a result, the values of the bits 24 and 23 are understood to be "01" if hit is detected.

If no match is detected, moreover, the values of the bits 24 and 23 are reset to "10" and match retrieval is performed again. As a result, the values of the bits 24 and 23 are understood to be "10" if match is detected whereas if no match is detected, the values of the bits 24 and 23 are understood to be "11".

The aforesaid operation is repeated from STEP 2, . . . , STEP 12 likewise, and it is detected whether the value of each 2-bit combination conforms to one of the following "00", "01", "10" and "11", and finally hit address of entry data having the lowest value is detected, whereby a new entry data is registered at this hit address.

Although match retrieval needs to be performed maximum 37 times according to the second embodiment of the present invention, mask data needs resetting only 12 times, which is half the whole times in the case of the first embodiment, and the new entry data can be registered by detecting the entry data having the lowest value. This data management method is effective in cases where needed time to perform one match retrieval is at an extremely high speed and where the number of times the mask register 18 is reset needs to be decreased. The number of bits for use in shifting the mask data is not restrictive at all but may be set properly as occasion demands and preferably one bit or two bits may be set as in this embodiment of the present invention in consideration of the relation between the number of times the mask register 18 is set and the number of times match retrieval is performed.

Although the candidate retrieval data having a retrieval width of 24 bits has been shown by way of example according to this embodiment of the present invention, the mask data has to be set 64 or 128 times when the bit width is set at 64 or 128. In this case, the mask-data shifting function and the automatic retrieval-data generating function work very effectively.

As set forth above, entry data need not to be rearranged and the entry data can be replaced at an extremely high speed so that it is easy to manage data since a specific entry data is detected out of the entry data registered in the associative memory, and a new entry data is registered at the entry address of the detected specific entry data in the data management method and apparatus according to the present invention.

The data management method and apparatus according to the present invention works basically such as described above.

Although unwanted entry data has been defined as what has the lowest value according to the aforesaid embodiment of the present invention, the same effect will be obtained even though a maximum value or any value nearest a specific value is used. The unwanted entry data means that it is fittingly set at the discretion of the user of the data management apparatus as already described by setting at least one condition for the detection of the specific entry data out of the plurality of entry data registered in the entry table, the one condition including order of registration, frequency in use, the lapse of time after the registration and so forth.

A detailed description has been given of the data management method and apparatus according to the present invention; however, the present invention is not limited to the aforesaid embodiments and it is needless to say that the present invention may be modified in various manners without departing from the spirit and the scope thereof.

What is claimed is:

1. A data management method for use when a demand for the registration of a new entry data is made in order to register the new entry data by deleting a specific entry data out of a plurality of n-bit (n=a positive integer) entry data registered beforehand, comprising the steps of:

registering the plurality of entry data having n-bit length;

performing match retrieval repeatedly by masking a (n−m(i)) bit (m(i)=a positive integer satisfying n≧m(i)) from the least significant bit side, whereby detecting the value of an m(i) bit from the side of the most significant bit matching the specific entry data;

performing match retrieval by shifting a bit to be masked next by an m(i+1) bit (m(i+1)=a positive integer satisfying (n−m(i))≧m(i+1)) toward the low order side and detecting a corresponding value of m(i+1) bit until no bit to be masked exists so as to detect the value of n bit matching the specific entry data; and obtaining an entry address at which the specific entry data matching the value of the n bit thus detected has been registered, so that the new entry data is registered at the entry address.

2. A data management method as claimed in claim 1, wherein match retrieval is performed again by the use of the value of the n bit matching the specific entry data thus detected so as to detect the entry address of the specific entry data.

3. A data management method as claimed in claim 1, wherein the specific entry data has the lowest value, the highest value or a value nearest a predetermined value.

4. A data management method as claimed in claim 1, wherein a condition for the detection of the specific entry data is one of entry data registration order, frequency in use and elapsed time after the registration.

5. A data management method as claimed in claim 1, wherein the m(i+1) bit is one bit or two bits.

6. A data management apparatus comprising:

an associative memory having at least one mask register for masking the predetermined bit of retrieval data, and at least a memory array in which a plurality of n-bit (n=positive integer) entry data are registered, the memory array being used for performing match retrieval of the retrieval data masked by the mask register and the plurality of entry data; and a control circuit for controlling the associative memory in such a way as performing match retrieval by masking an (n−m(i)) bit (m(i)=a positive integer satisfying n≧m(i)) from the least significant bit side of the retrieval data by means of the mask register, detecting the value of the m(i) bit from the side of the most significant bit matching the specific entry data according to a result of match retrieval, and performing match retrieval repeatedly by shifting a bit to be masked next by an m(i+1) bit (m(i+1)=a positive integer satisfying (n−m(i))≧m(i+1)) toward the low order side and detecting a corresponding value of m(i+1) bit until no bit to be masked exists so as to detect not only the value of n bit matching the specific entry data but also an entry address at which the specific entry data has been registered.

7. A data management apparatus as claimed in claim 6, wherein the associative memory feeds to the control circuit a hit detection signal for indicating that at least one entry data matching the retrieval data has been registered in the memory array.

8. A data management apparatus as claimed in claim 6, wherein the control circuit is formed of only hardware.

9. A data management apparatus as claimed in claim 6, wherein the associative memory and the control circuit are formed of a semiconductor chip.

10. A data management apparatus as claimed in claim 6, wherein the control circuit is formed of only software.

11. A data management apparatus as claimed in claim 6, wherein the control circuit is formed of a combination of software and hardware.

12. A data management apparatus as claimed in claim 6, wherein the m(i+1) bit is one bit or two bits.

13. A data management apparatus as claimed in claim 6, wherein the mask register has a function of shifting a bit to be masked by the m(i+1) bit each time toward the low order side under the control of the control circuit.

14. A data management apparatus as claimed in claim 6, wherein the associative memory further includes an input data register for holding the retrieval data and wherein the input data register is capable of setting and resetting the value of the retrieval data on a 1-bit basis under the control of the control circuit.

* * * * *